United States Patent [19]

Cornelissen

[11] Patent Number: 5,043,601
[45] Date of Patent: Aug. 27, 1991

[54] WIDE-BAND AMPLIFIER USEFUL FOR SQUAREWAVE SIGNALS

[75] Inventor: Bernardus H. J. Cornelissen, Bergeijk, Netherlands

[73] Assignee: U.S. Philips Corporation, New York, N.Y.

[21] Appl. No.: 395,130

[22] Filed: Aug. 17, 1989

[30] Foreign Application Priority Data

Aug. 26, 1988 [NL] Netherlands .................. 8802103

[51] Int. Cl.⁵ .......................................... H03K 19/00
[52] U.S. Cl. ................................. 307/446; 307/570; 307/443; 307/263
[58] Field of Search ............. 307/263, 296.7, 443, 307/446, 570, 592, 594

[56] References Cited

U.S. PATENT DOCUMENTS

| | | | |
|---|---|---|---|
| 4,578,597 | 3/1986 | Soneda et al. | 307/263 |
| 4,614,884 | 9/1986 | Nagano | 307/443 |
| 4,777,388 | 10/1988 | Widener | 307/443 |
| 4,779,014 | 10/1988 | Masuoka et al. | 307/443 |
| 4,810,902 | 3/1989 | Storti et al. | 307/446 |

FOREIGN PATENT DOCUMENTS 0232969  7/1987  European Pat. Off. ............. 307/448

Primary Examiner—Stanley D. Miller
Assistant Examiner—T. Cunningham
Attorney, Agent, or Firm—Bernard Franzblau

[57] ABSTRACT

An amplifier arrangement comprising a first (T1) and a second (T2) field-effect transistor of the same conductivity type and a driver circuit (Q1, Q2, Q3, T3, T4, T5, I) which is responsive to a signal to be amplified at the input terminals (3, 4) to drive the respective drain electrodes of the two field-effect transistors (T1, T2). A resistive element (R) is formed between the drain and the gate electrode of the first field-effect transistor (T1) and a capacitive element (C) is formed between the gate and the source electrode. Together with said elements (R, C) the first field-effect transistor (T1) constitutes a reactance circuit having an inductive character, which is arranged in parallel with the parasitic gate-source capacitance of the second field-effect transistor (T2). This results in an improved step-function response and edge steepness of step-function signals on the output terminal (5), i.e., at the drain electrode of the second field-effect transistor (T2), in comparison with an amplifier arrangement without said reactance circuit. The circuit is very suitable for integration in BICMOS technology.

6 Claims, 1 Drawing Sheet

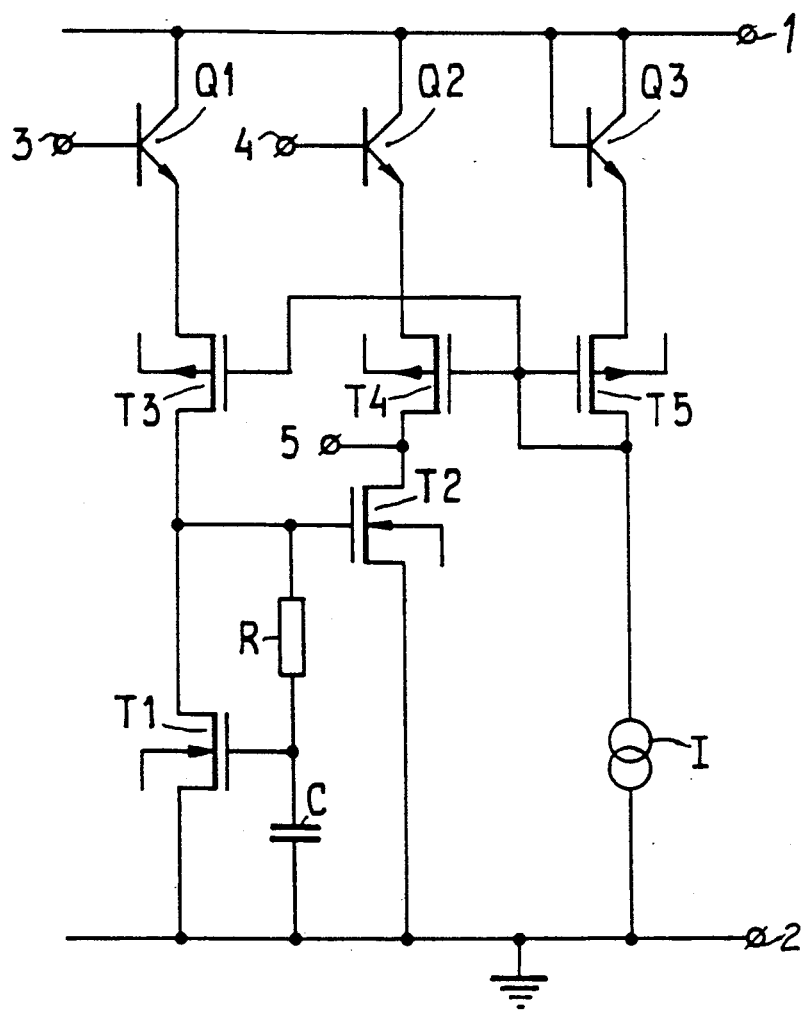

WIDE-BAND AMPLIFIER USEFUL FOR SQUAREWAVE SIGNALS

BACKGROUND OF THE INVENTION

This invention relates to an amplifier arrangement for amplifying an input signal, comprising:
a first and a second field-effect transistor of a first conductivity type, and
a driver circuit for driving the first and the second transistor dependent on the input signal.

As is known, step-function signals, for example, digital squarewave signals, may be thought to consist of an infinite sequence of harmonic signals. For amplifying such signals it is, in principle required to use amplifiers having a maximal bandwidth because otherwise the waveform of the amplified output signal will differ excessively from that of the input signal to be amplified. This specifically results in the signal edges being affected.

The step-function response of an amplifier arrangement can be corrected inductively, for example by arranging an inductance parallel to the load of the amplifier arrangement, inter alia to cancel the effect of stray and wiring capacitances. Such an inductance speeds up the charging (or discharging) process of a capacitive load or the capacitive component thereof, which improves the steepness of the edges of the step-function signal. The edge steepness of a step-function signal is represented inter alia by its rise time, which is to be understood to mean the time required for a signal to rise from 10% to 90% of its final steady value.

In integrated circuits inductances cannot be formed on the substrate of the circuit, so that these elements have to be added externally to the integrated circuit. Such external elements are generally less desirable.

SUMMARY OF THE INVENTION

Therefore, it is an object of the present invention to provide an amplifier arrangement, in particular for amplifying digital signals, which does not require the use of external inductances or other correction networks to improve the steepness of the edges of the output signal. In accordance with the invention this is achieved in an amplifier arrangement of the type defined in the opening sentence in that
the driver circuit is coupled to a first power-supply terminal and has a first and a second output terminal,
the drain-source path of the first transistor is coupled between the first output of the driver circuit and a second power-supply terminal,
the drain-source path of the second transistor is coupled between the second output of the driver circuit and the second power-supply terminal, and
the drain of the first transistor is coupled to the gate of the second transistor and through a resistive element to its gate, which is coupled to the second power-supply terminal through a capacitive element.

In the arrangement in accordance with the invention the two field-effect transistors are not driven by applying a drive signal to their gate electrodes, as is customary, but the drive signal is applied to their drain electrodes. The resistive and capacitive elements then constitute a phase shifting circuit such that the drive signal applied to the drain electrode of the first field-effect transistor will appear on the gate electrode of said transistor with a phase lag. Consequently, the drain current thus produced will lag the applied drain-source voltage, so that a reactance circuit having an inductive character is obtained.

In the arrangement in accordance with the invention this inductive reactance circuit is arranged in parallel with the parasitic gate-source capacitance of the second field-effect transistor, as a result of which this second field-effect transistor is turned on and turned off more rapidly. This results in the output signal, which appears on the drain electrode of this field-effect transistor, having steeper edges than without the reactance circuit.

The arrangement in accordance with the invention is very suitable for use in integrated amplifier arrangements. Another embodiment of the invention, in which the amplifier arrangement is fabricated in "Bipolar Complementary Metal Oxide Silicon" (BICMOS) technology, in which both bipolar and unipolar components are formed in the same substrate, is characterized in that the arrangement is constructed as an integrated circuit in which the resistive element is an integrated resistor.

A further embodiment of the invention is characterized in that the capacitive element is constituted by the gate-source capacitance of the first field-effect transistor.

The arrangement can be dimensioned in such a way that when the first field-effect transistor is turned off the voltage on its gate electrode does not decrease below the threshold voltage of the field-effect transistor, which precludes a loss of time when the field-effect transistor is turned on again. To this end an embodiment of the invention is characterized in that the resistive element has a resistance between approximately 10 and 100 kohms and the capacitive element has a capacitive action as a capacitance between 100 and 1000 pF.

A driver circuit which is very suitable for fabrication in BICMOS technology is characterized in that the driver circuit comprises a first and a second bipolar transistor, whose base electrodes respectively constitute a first and a second input terminal for the signal to be amplified, which transistors have their collector-emitter paths coupled to the first power-supply terminal and to the source electrodes of a third and a fourth field-effect transistor of a second conductivity type, respectively, the drain electrodes of the third and fourth field-effect transistors constitute the first and the second output of the drive circuit and the gate electrodes of the third and the fourth field-effect transistors are interconnected and are connected to the output of a current reference circuit.

The input signal to be amplified can be applied in phase opposition to the base electrodes of the first and the second bipolar transistors. However, the amplifier arrangement can also be driven asymmetrically by maintaining one of the base electrodes at a fixed potential and applying the input signal to the other base electrode.

Yet another embodiment of the amplifier arrangement in accordance with the invention is characterized in that the current-reference circuit comprises, between the first and the second supply terminal, the series arrangement of a third bipolar transistor connected as a diode, the source-drain path of a fifth field-effect transistor of the second conductivity type and a current-reference element, the drain and gate electrodes of said fifth field-effect transistor being interconnected and constituting the output of the current-reference circuit.

BRIEF DESCRIPTION OF THE DRAWING

A preferred embodiment of an integrated amplifier arrangement in accordance with the invention will now be described in more detail, by way of example, with reference to the drawing, which shows the circuit diagram of the arrangement.

DESCRIPTION OF THE PREFERRED EMBODIMENTS

The arrangement shown in the Figure comprises a first N-channel insulated-gate field-effect transistor T1 (generally referred to as MOST "Metal Oxide Silicon Transistor" in the English literature) and a second N-channel insulated-gate field-effect transistor T2 of the enhancement mode type. The source electrodes of the two MOS transistors T1, T2 are connected to a power-supply terminal 2, which constitutes the signal ground. The drain electrode of T1 is connected to the gate electrode of T2.

In accordance with the invention a resistor R, which is integrated in the substrate, is arranged between the gate electrodes of the MOS transistors T1 and T2 and the element having a capacitive action and forming a part of the MOS transistor T1. The capacitive element is represented diagrammatically as a capacitor C arranged between the gate electrode T1 and the power-supply terminal 2.

The drain electrodes of T1 and T2 are connected to the respective drain electrodes of a third and a fourth P-channel insulated-gate field-effect transistor T3 and T4. The source electrodes of T3 and T4 are connected to the emitters of a first and a second bipolar emitter-follower transistor Q1, Q2, both of the NPN type. The transistors Q1 and Q2 have their collectors connected to a power-supply terminal 1. The bases of the transistors Q1 and Q2 constitute a first input terminal 3 and a second input terminal 4, respectively.

The gate electrodes of the MOS transistors T3 and T4 are interconnected and connected to the gate electrode of a fifth P-channel insulated-gate field-effect transistor T5. This MOS transistor T5 is also of the enhancement type. The drain and gate electrodes of T5 are interconnected so that the MOS transistors T3, T4 and T5 constitute a current-mirror circuit. The source electrode of T5 is connected to the emitter of a third bipolar NPN transistor Q3, which has its collector and its base connected to the power-supply terminal 1. Consequently the transistor Q3 functions as a diode.

The drain electrode of the MOS transistor T5 is connected to a current reference element I, whose other end is connected to the power-supply terminal 2. The current reference element I supplies the bias current for the arrangement and may be of any suitable integrable configuration known per se.

The output signal of the arrangement is taken from the output terminal 5, which is connected to the drain electrode of the MOS transistor T2. The operation of the arrangement is as follows.

By applying step-function signals to be amplified, for example, a digital squarewave signal in phase opposition, to the first input terminal 3 and the second input terminal 4, the transistors Q1 and Q2 are alternately turned on and turned off. This means that the circuits comprising the MOS transistors T1, T3 and the transistors T2, T4 are alternately turned on or turned-off.

Consequently, the voltage on the drain electrode of the second MOS transistor T2 will vary between the power-supply voltage minus the voltage across the collector-emitter path of the transistor Q2, and ground.

Since R and C constitute a phase shifting network the gate voltage of the MOS transistor T1 will lag its drain voltage when this transistor is turned on or turned off at its drain electrode, depending on the values of R and C. As a result of this, the drain current will also lag the drain voltage. Therefore, the MOS transistor T1, the resistor R and the capacitor C together appear as an inductive circuit arranged in parallel with the gate-source circuit of the second MOS transistor T2. This results in the stray capacitance at the gate electrode of T2 being charged and discharged more rapidly than it would without the parallel connected inductive circuit. This means that the transistor T2 is turned on and turned off comparatively rapidly so that the output signal on its drain electrode will have comparatively steep edges.

When the bandwidth of the arrangement is thus in fact increased, the occurrence of a delay of the output signal relative to the applied signal to be amplified can be avoided by suitably dimensioning the arrangement. The delay time is dictated by the choice of the values of R and C. In practice a value for R between 10 and 100 kOhms and for C between 100 and 1000 pF is found to be satisfactory. With these values it can also be achieved that when the MOS transistor T1 is turned off its gate voltage remains at a value above the threshold voltage, obviously related to the frequency of the signal to be amplified. When T1 is turned on again there will be no or only a very small delay because the gate voltage need not first be brought above its threshold value before the transistor T1 can conduct.

It is obvious that the arrangement can be modified in various ways, for example, by replacing the current-mirror comprising P-channel MOS transistors by a current-mirror circuit comprising bipolar PNP transistors. Further modifications of the arrangement will be obvious to those skilled in the art without departing from the scope and spirit of the invention.

I claim:

1. An amplifier arrangement for amplifying input signals, comprising:
   a first and a second field-effect transistor of a first conductivity type,
   a driver circuit for driving the first and the second field-effect transistor in response to the input signals, characterized in that
   the driver circuit is coupled to a first power-supply terminal and has a first and a second output terminal,
   a drain-source path of the first field-effect transistor is coupled between the first output terminal of the driver circuit and a second power-supply terminal,
   a drain-source path of the second field-effect transistor is coupled between the second output terminal of the driver circuit and the second power-supply terminal, and
   a drain of the first field-effect transistor is coupled to a gate of the second field-effect transistor and through a resistive element to a gate of said first field-effect transistor, said gate of said first field-effect transistor is coupled to the second power-supply terminal through a capacitive element.

2. An amplifier arrangement as claimed in claim 1, wherein the arrangement is constructed as an integrated circuit in which the resistive element is an integrated resistor.

3. An amplifier arrangement as claimed in claim 1 wherein the driver circuit comprises a first and a second bipolar transistor whose base electrodes respectively constitute a first and a second input terminal for said input signals to be amplified, which transistors have their collector-emitter paths coupled between the first power-supply terminal and a source electrode of a third and a fourth field-effect transistor of a second conductivity type respectively, drain electrodes of the third and fourth field effect transistors comprising the first and the second output of the driver circuit and gate electrodes thereof being interconnected and coupled to an output of a current-reference circuit.

4. An amplifier arrangement as claimed in claim 3, wherein the current-reference circuit comprises, between the first and the second supply terminal, a series connection of a third bipolar transistor connected as a diode, the source-drain path of a fifth field-effect transistor of the second conductivity type and a current-reference element, drain and gate electrodes of said fifth field-effect transistor being interconnected and constituting the output of the current-reference circuit.

5. An amplifier arrangement for amplifying input signals, comprising:

a first and a second field-effect transistor of a first conductivity type, a driver circuit for driving the first and the second field-effect transistor in response to the input signals, characterized in that the driver circuit is coupled to a first power-supply terminal and has a first and a second output terminal, a drain-source path of the first field effect transistor is coupled between the first output terminal of the driver circuit and a second power-supply terminal, 4 a drain-source path of the second field effect transistor is coupled between the second output terminal of the driver circuit and the second power-supply terminal, and a drain of the first field-effect transistor is coupled to a gate of the second field-effect transistor and through a resistive element to a gate of said first field-effect transistor, said gate of said first field-effect transistor is coupled to the second power-supply terminal through the gate-source capacitance of the first field-effect transistor.

6. An amplifier arrangement as claimed in claim 1, wherein the resistive element has a resistance between approximately 10 and 100 kohms and the capacitive element has a capacitance between 100 and 1000 pF.

* * * * *

UNITED STATES PATENT AND TRADEMARK OFFICE
CERTIFICATE OF CORRECTION

PATENT NO. : 5,043,601

DATED : August 27, 1991

INVENTOR(S) : BERNARDUS H.J. CORNELISSEN

It is certified that error appears in the above-identified patent and that said Letters Patent is hereby corrected as shown below:

Col. 6, after line 26, insert claims 7 and 8 as follows:

--7. An amplifier arrangement as claimed in Claim 1 wherein said resistive element, said capacitive element and said first field effect transistor together constitute a reactance circuit having an inductive character and coupled in parallel with the gate-source circuit of the second field effect transistor.

8. An amplifier arrangement as claimed in Claim 1 wherein said resistive element, said capacitive element and said first field effect transistor together constitute a reactance circuit having an inductive character, and wherein the resistance of said resistive element and the capacitance of said capacitive element are chosen such that when the input signals are of a polarity that tend to drive the first field effect transistor towards cutoff, a voltage is developed at the gate electrode of the first field effect transistor which does not drop below the threshold voltage of said first field effect transistor.--

Signed and Sealed this

Eighth Day of December, 1992

*Attest:*

DOUGLAS B. COMER

*Attesting Officer*     *Acting Commissioner of Patents and Trademarks*